(12) United States Patent
Kozakai et al.

(10) Patent No.: US 7,488,539 B2
(45) Date of Patent: Feb. 10, 2009

(54) ADHESIVE COMPOSITION AND SHEET HAVING AN ADHESIVE LAYER OF THE COMPOSITION

(75) Inventors: Shouhei Kozakai, Annaka (JP); Nobuhiro Ichiroku, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 67 days.

(21) Appl. No.: 11/583,699

(22) Filed: Oct. 20, 2006

(65) Prior Publication Data
US 2007/0090299 A1  Apr. 26, 2007

(30) Foreign Application Priority Data
Oct. 20, 2005 (JP) .............. 2005-306238
Oct. 17, 2006 (JP) .............. 2006-282285

(51) Int. Cl.
B32B 9/04 (2006.01)
B32B 27/00 (2006.01)
B32B 27/06 (2006.01)

(52) U.S. Cl. .................. 428/447; 428/473.5

(58) Field of Classification Search .......... 525/107; 250/370.01
See application file for complete search history.

(56) References Cited

U.S. PATENT DOCUMENTS

| | | | |
|---|---|---|---|
| 5,032,438 A * | 7/1991 | Sakumoto et al. | 428/41.8 |
| 5,530,063 A * | 6/1996 | Nagai et al. | 525/101 |
| 5,538,793 A * | 7/1996 | Inokuchi et al. | 428/407 |
| 5,677,393 A * | 10/1997 | Ohmori et al. | 525/423 |
| 6,214,152 B1 * | 4/2001 | Ross et al. | 156/245 |
| 6,525,160 B1 * | 2/2003 | Goda et al. | 528/29 |
| 7,125,948 B2 * | 10/2006 | Kozakai et al. | 528/32 |
| 2001/0031828 A1 * | 10/2001 | Honda et al. | 525/107 |
| 2002/0137309 A1 * | 9/2002 | Senoo et al. | 438/460 |
| 2003/0049883 A1 * | 3/2003 | Yajima et al. | 438/106 |
| 2003/0216505 A1 * | 11/2003 | Akiba et al. | 524/588 |
| 2003/0216515 A1 | 11/2003 | Akiba et al. | |
| 2004/0044132 A1 * | 3/2004 | Kozakai et al. | 525/100 |
| 2004/0068076 A1 * | 4/2004 | Kozakai et al. | 528/15 |
| 2004/0105990 A1 * | 6/2004 | Shiobara et al. | 428/473.5 |
| 2004/0213994 A1 * | 10/2004 | Kozakai et al. | 428/354 |
| 2005/0065296 A1 * | 3/2005 | Kozakai et al. | 525/530 |
| 2005/0184402 A1 * | 8/2005 | Senoo et al. | 257/783 |
| 2007/0191552 A1 * | 8/2007 | Ichiroku et al. | 52/476 |

FOREIGN PATENT DOCUMENTS

| | | |
|---|---|---|
| EP | 0 661 334 A1 | 7/1995 |
| JP | 3-189127 A | 8/1991 |

(Continued)

*Primary Examiner*—Randy Gulakowski
*Assistant Examiner*—Robert Loewe
(74) *Attorney, Agent, or Firm*—Birch, Stewart, Kolasch & Birch, LLP (57) ABSTRACT

An adhesive composition comprising
5 to 60 wt % of (A) a polyimidesilicone resin
5 to 60 wt % of (B) an epoxy resin having a softening point of 80° C. or lower,
0.001 to 20 wt % of (C) at least one epoxy resin curing catalyst selected from imidazole compounds and dicyandiamide
20 to 70 wt % of (D) spherical silica having an average diameter of 0.1 to 10 μm, and
5 to 30 wt % of (E) spherical fine particles of silicone rubber composite, wt % being based on a total weight of the composition.

6 Claims, 1 Drawing Sheet

FOREIGN PATENT DOCUMENTS

| | | |
|---|---|---|
| JP | 3221756 A | 9/1991 |
| JP | 4-264003 A | 9/1992 |
| JP | 6-200216 A | 7/1994 |
| JP | 7-224259 A | 8/1995 |
| JP | 8-27239 A | 1/1996 |
| JP | 8-27427 A | 1/1996 |
| JP | 9-67558 A | 3/1997 |
| JP | 10-60111 A | 3/1998 |
| JP | 2984549 B2 | 9/1999 |
| JP | 2002-256236 A | 9/2002 |

* cited by examiner

Figure 4

US 7,488,539 B2

ADHESIVE COMPOSITION AND SHEET HAVING AN ADHESIVE LAYER OF THE COMPOSITION

This application claims benefit of Japanese Patent applications No. 2005-306238 filed on Oct. 20, 2005, and No.2006-282285 filed on Oct. 17, 2005, the contents of which are hereby incorporated by reference.

FIELD OF THE INVENTION

The present invention relates to an adhesive composition, specifically to an adhesive composition which is significantly improved in minimum melt viscosity and gives a cured product flexible enough to show no cracking or exfoliation. The present invention relates also to a sheet having an adhesive layer prepared from the present composition.

BACKGROUND OF THE INVENTION

Associated with recent miniaturization of electric appliances, miniaturization of a substrate with semiconductor chips mounted thereon is required. To mount semiconductor chips on the substrate, adhesive films are used. As a silicone wafer is getting thinner, an adhesive film is desired which can be pressure bonded at a lower temperature with a lower pressure to prevent the wafer from warping, cracking during the pressure bonding, or to prevent a substrate from cracking when the chip is thermocompression bonded to the substrate.

In Ball Grid Array (BGA) package, a semiconductor chip is adhered to a wiring board made from resin and then encapsulated with a molding compound. The wiring board has a wiring pattern and spaces between the patterned wiring tend to remain as voids in cured adhesive. To prevent voids from occurring, melt viscosity of the adhesive may be lowered. However, in a streamlined process where the adhesive is not cured in chip mounting process but cured in the encapsulation process and thinner encapsulation is employed, chips on the molten adhesive may be shifted or dislocated. Thus, an adhesive film is desired which can be pressure bonded at low temperature and at low pressure and has appropriate minimum melt viscosity.

Meanwhile, a semiconductor device is generally prepared by the following processes:

i) fixing a large-diameter silicon wafer on a pressure sensitive tape called dicing tape, ii) dicing the wafer, iii) picking up the diced chip from the dicing tape, and iv) thermocompression bonding the picked up chip on a lead flame using curable liquid adhesive, i.e., die bonding adhesive.

Recently, a tape or sheet used both in the dicing and the die bonding processes, hereinafter referred to as dicing and die bonding tape, has been developed. In the dicing process, the tape is used to fix a silicon wafer, preventing diced chips from flying off. The diced chip is picked up with an adhesive layer of the tape attached on its bottom surface and then the chip is bonded to a lead flame via the adhesive layer which is then cured. The adhesive layer of this tape, too, needs to be improved in the aforesaid points.

As an adhesive, heat resistant siloxane-modified polyimide or polyamideimide has been proposed in Japanese Patent Applications Laid-Open No.3-189127 and No.4-264003. These resins, however, do not show satisfactory adhesion strength or heat resistance.

Japanese Patent Application Laid-Open No.10-60111 discloses a siloxane-modified polyamideimide having two or more of maleimide groups. The siloxane-modified polyamideimide improved properties at high temperature but has low adhesion to a copper foil.

Japanese Patent Applications Laid-Open No.7-224259 and No.8-27427 disclose heat resistant adhesive film comprising a polyimidesilicone and an epoxy resin. The polyimidesilicone does not have curable functional groups and consequently adhesion strength and reliability of the adhesion are not good.

Japanese Patent No.3221756 discloses a heat resistant adhesive film comprising a polyimidesilicone having phenolic hydroxide groups and an epoxy resin. The adhesive film is not satisfactory in bonding property at a low temperature and a low pressure and voids or shifted chips are observed.

Japanese Patent Application Laid-Open No.9-67558 discloses a dicing and die bonding tape comprising a thermoplastic polyimide layer formed on a plastic film substrate. The polyimide layer is thermocompression bonded to a silicon wafer so strongly that picking up of diced chips is not easy. Further, adhesion strength, particularly adhesion strength after exposed to humid or at a high temperature required in wire-bonding, encapsulation, and solder reflow processes, of the thermoplastic polyimide is not strong due to the thermoplasticity.

Japanese Patent Application Laid-Open No.2002-256236 and Japanese Patent No.2984549 disclose a dicing and die bonding tape comprising a resin layer composed of (A) polyimide resin, (B) epoxy resin, (C)phenolic resin, and (D)curing promoter which is formed on a film substrate. The die bonding layer of the tape comprises a curable epoxy resin to show a strong adhesion strength even after being exposed to humid or high temperature.

However, picking up of diced chips tends to be difficult to control with the aforesaid dicing and die bonding tape. A reason for this is considered to be as follows: A pressure sensitive adhesive layer of the tape is made from a radiation polymerizable composition comprising (meth)acrylate copolymer, a polymer having (meth)acryl groups or multifunctional acrylic compounds, and a photoinitiator; These components are miscible with the epoxy rein and tends to adhere strongly to the epoxy resin in UV-ray polymerization reaction process or to the softened epoxy resin in thermocompression bonding in the dicing process. The pressure sensitive adhesion strength of the pressure sensitive adhesive layer to the die bonding layer tends to change with time, which makes the picking up of the diced chips more difficult.

SUMMARY OF THE INVENTION

An object of the present invention is to provide adhesive composition to form an adhesive layer, and a dicing and die bonding sheet comprising the adhesive layer, which sheet allows one to pick up chips with ease and provides a biding layer between a chip and a substrate having a low modulus of elasticity, without causing displacement of a chip.

The present invention is An adhesive composition comprising 5 to 60 wt % of (A) a polyimidesilicone resin 5 to 60 wt % of (B) an epoxy resin having a softening point of 80° C. or lower, 0.001 to 20 wt % of (C) at least one epoxy resin curing catalyst selected from imidazole compounds and dicyandiamide 20 to 70 wt % of (D) spherical silica having an average diameter of 0.1 to 10 μm, and 5 to 30 wt % of (E) spherical fine particles of silicone rubber composite, wt % being based on a total weight of the composition.

A cured product of the present adhesive composition has low modulus of elasticity, small coefficient of linear expansion, and low moisture absorption and is suitable for fixing various electronic elements. The present dicing and die bonding tape firmly fixes a silicon wafer during the dicing process and allows the diced chips to be picked up with ease because of adequate peel strength between the pressure sensitive adhesive layer and the adhesive layer. By thermocompression bonding the picked up chips to a lead frame and then heat curing, the chips are adhered firmly. The present dicing and die bonding sheet is suitable for manufacturing semiconductor devices.

DESCRIPTION OF THE PREFERRED EMBODIMENTS

In the present invention, the polyimidesilicone resin (A) is composed of a repeating unit represented by the following formula (2)

wherein X is a tetravalent organic group, Y is a divalent organic group and q is an integer of from 1 to 300.

The polyimidesilicone resin (A) comprises siloxane moieties. That is, the polyimidesilicone resin (A) comprises repeating units with at least one of X and Y comprising siloxane moieties. The polyimidesilicone resin (A) is contained in the present composition in an amount of from 5 to 60 wt %, preferably from 20 to 50 wt %, based on a total weight of the composition.

A polyamic acid resin composed of repeating units of the following formula (3), which is a precursor of the polyimide, may be used wherein X is a tetravalent organic group, Y is a divalent organic group and q is an integer of from 1 to 300. Preferably, the polyimide resin of the above formula (2) is used because water, which is a by-product of imidization reaction, i.e., ring closure with dehydration, in heat curing process after die bonding, may cause exfoliation at interface between the adhesive composition and a substrate.

In the formulas (2) and (3), q is an integer of from 1 to 300, preferably from 2 to 300, particularly from 5 to 300. A resin with q below the aforesaid lower limit may not provide satisfactory adhesion strength, and a resin with q above the aforesaid upper limit may not be thermocompression bonded well. Most preferably, q is such a number that the polyimidesilicone resin (A) has a glass transition temperature of from 100 to 200° C., preferably from 120 to 190° C.

The polyimide resin of the formula (2) can be prepared by subjecting the polyamic acid resin of the formula (3) to dehydration and ring closure reaction according to a known method. The polyamic acid can be prepared by subjecting a tetracarboxylic acid dianhydride of the formula (4)

wherein X is as defined above, to a reaction with about equimolar diamine of the formula (5)

$$H_2N-Y-NH_2 \qquad (5)$$

wherein Y is as defined above, in an organic solvent according to a conventional method.

The followings are examples of the tetracarboxylic acid dianhydride of the formula (4). These can be used in a mixture of two or more of them.

In the diamine of the aforesaid formula (5), it is preferred that 1 to 80 mole %, more preferably from 1 to 60 mole %, of the diamine is the diaminosiloxane compound of the following formula (1) because of good solubility of the resulting polyimide resin in an organic solvent, strong adhesion to a substrate and low modulus of elasticity or flexibility of a cured product of the polyimide resin.

(1)

In the formula, $R^3$ is a divalent organic group having 3 to 9 carbon atoms, $R^4$ may be the same with or different from each other and is a substituted or unsubstituted monovalent hydrocarbon group having 1 to 8 carbon atoms, and m is an integer of from 1 to 200.

Examples of $R^3$ include divalent groups which may have an ether moiety, for example, alkylene groups such as those of the formulas, —$(CH_2)_3$—, —$(CH_2)_4$—, —$CH_2CH(CH_3)$—, —$(CH_2)_6$—, and —$(CH_2)_8$—; and arylene groups as shown below;

alkarylene groups such as benzylene group; oxyalkylene groups such as those of the formulas —$(CH_2)_3$—O—, and —$(CH_2)_4$—O; and oxyarylene groups as shown below; and oxyalkarylene groups as the one shown below.

Examples of $R^4$ include alkyl groups such as methyl, ethyl, propyl, isopropyl, butyl, isobutyl, tert-butyl, hexyl, cyclohexyl, 2-ethylhexyl, and octyl groups; alkenyl groups such as vinyl, allyl, propenyl, isopropenyl, butenyl, isobutenyl, and hexenyl groups; aryl groups such as phenyl, tolyl, and xylyl groups; and substituted groups thereof such as chloromethyl, bromoethyl, 3,3,3-trifluoropropyl groups; among which methyl and phenyl groups are preferred. In the formula (1), m is an integer of from 1 to 200, preferably from 1 to 100, more preferably from 1 to 80.

Examples of the siloxanediamine of the formula (1) are as shown below. These can be used in a mixture of two or more of them.

Examples of the diamine of the formula (5) besides the aforesaid siloxydiamine include aromatic diamines such as p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenylsulfone, 4,4'-diaminodiphenylsulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenyl thioether)benzene, 1,4-bis(m-aminophenyl thioether)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, and bis[4-(4-aminophenoxy)phenyl]sulfone, 2,2-bis[4-(4-aminophenoxy)phenyl]perfluoropropane, among which p-phenylenediamine, m-phenylenediamine, 4,4'-diaminodiphenylmethane, 4,4'-diaminodiphenyl ether, 1,4-bis(3-aminophenoxy)benzene, 1,4-bis(4-aminophenoxy)benzene, 2,2-bis[4-(4-aminophenoxy)phenyl]propane, and 2,2-bis[3-methyl-4-(4-aminophenoxy)phenyl]propane are preferred.

The polyimidesilicone resin (A) may have a phenolic hydroxyl group to react with the epoxy resin (B). The phenolic hydroxyl group can be introduced to the polyimidesilicone resin by using a diamine compound having a phenolic hydroxyl group. Examples of such diamine compound are as shown below.

A represents a single bond or a group shown below

-continued

B represents a single bond or a group shown below

In the above formulas, $R^2$ is a hydrogen atom, halogen atom such as fluorine, bromine or iodine, or a substituted or unsubstituted monovalent $C_{1-8}$ hydrocarbon group such as an alkyl, alkenyl, alkynyl, trifluoromethyl or phenyl group, and n is an integer of from 1 to 5. The moieties A and B, respectively, may be a mixture of two or more of the groups. R is a hydrogen atom, halogen atom, or substituted or unsubstituted monovalent hydrocarbon group.

Examples of $R^2$ and R include the groups presented for $R^4$ above and alkenyl groups such as ethynyl, propynyl, butynyl and hexynyl groups.

Another example of the diamine compound having a phenolic hydroxyl group is represented by the following formula wherein R is a hydrogen atom, halogen atom such as fluorine or iodine, or a monovalent substituted or unsubstituted $C_{1-8}$ hydrocarbon group such as alkyl, alkenyl, alkynyl, trifluoromethyl, or phenyl group, and X represents a single bond, methylene or propylene group. R's may be different from each other.

Preferably, the diamine compound of the following formula (3) is used as the diamine compound having a phenolic hydroxyl group.

(3)

wherein $R^2$ is as defined above.

The diamine compound having a phenolic group is used in an amount of from 5 to 90 mol %, based on a total molar amount of the diamine compound, which amount typically corresponds to 5 to 60 wt %, particularly 10 to 40 wt % of a total weight of the diamine compound. If the amount is below the aforesaid lower limit, adhesion strength of a composition may be lower. If the amount is above the aforesaid upper limit, an adhesive layer may have insufficient flexibility.

A monoamine having a phenolic hydroxyl group can be used, for example, the monoamine compounds as shown below.

In the above formulas, $R^2$ is as defined above. D may be a mixture of the two groups and p is an integer of from 1 to 3.

The monoamine having a phenolic group may be used in an amount of from 0.5 to 5 mol %, based on a total molar amount of the diamine compounds.

The aforesaid amine compounds may be used in a mixture of two or more of the compounds.

The polyamic acid is prepared by dissolving the aforesaid starting materials in a solvent, which is then subjected to a reaction typically at a temperature of 80° C. or lower, preferably from 0 to 40° C. in an inactive atmosphere. The polyamic acid obtained is heated at a temperature of from 100 to 200° C., preferably from 150 to 200° C., whereby the carboxylic acid amide is dehydrated to effect ring closure to form an intended polyimide resin.

The organic solvent used in the above reaction need not completely dissolve the aforesaid starting materials as far as it is inactive to the polyamic acid obtained. Examples of the solvent include tetrahydrofuran, 1,4-dioxane, cyclopentanone, cyclohexanone, γ-butylolactone, N-methylpyrrolidone, N,N-dimethylacetamide, N,N-dimethylformamide, and dimethylsulfoxide, among which aprotic polar solvent are preferred, particularly N-methylpyrrolidone, cyclohexanone, γ-butylolactone and mixtures thereof are preferred.

Preferably, azeotropic solvent such as toluene and xylylene are used to facilitate the dehydration and ring closure reaction. The dehydration and ring closure reaction can be performed at a low temperature using a mixture of acetic acid anhydride with pyridine.

In order to adjust molecular weight of the polyamic acid and polyimide resin, it is possible to add anhydrous dicarboxylic acids, such as maleic anhydride and phthalic anhydride, and/or monoamines, such as aniline, n-butylamine, and the aforesaid monoamine having a phenolic hydroxyl group, with proviso that dicarboxylic acid dianhydride is added, in general, in amount of 5 moles or less per 100 moles of tetracarboxylic acid dianhyride, and the monoamine may be added, in general, in an amount of 5 moles or less per 100 moles of diamine.

The polyimide resin obtained preferably has a glass transition temperature of 200° C. or lower. If the glass transition temperature is above the aforesaid temperature, the adhesive layer comprising such polyimide may not be thermocompression bonded well.

The epoxy resin (B) used in the present invention has a softening point of 80° C. or lower in order for the adhesive layer can be pressure bonded at a low temperature and at a low pressure. The epoxy resin (B) preferably has at least two epoxy groups per molecule. Examples of the epoxy resin include diglycidyl ethers of bis(4-hydroxyphenyl)methane and 2,2'-bis(4-hydroxyphenyl)propane or halides thereof, and polycondensates thereof (so-called bisphenol F type epoxy resins and bisphenol A type epoxy resins); diglycidyl ether of resorcin, hydroquinone, and methylresorcin; 1,4-bis (2,3-epoxypropoxy)benzene, 4,4'-bis(2,3-epoxypropoxy) diphenyl ether, and hydrogenated compound thereof; butadiene diepoxide, vinylcyclohexene dioxide; 1,4-bis(2,3-epoxypropoxy)cyclohexene, bis(3,4-epoxy-6-methylcyclohexylmethyl)adipate; epoxy glycidyl ethers or polyglycidyl esters obtained by condensation of 1,2-dihydroxybenzene (or resorcinol), polyhydric phenols or polyhydric alcohols with epichlorohydrin; liquid epoxy novolac resins (i.e., novolac type epoxy resins) obtained by condensation of novolac type phenolic resins (or halogenated novolac type phenolic resins) such as phenol novolac and cresol novolac with epichlorohydrin, and mixtures thereof.

A mono-epoxy compound can be used in combination with the epoxy resin. Exemplary mono-epoxy compounds include styrene oxide, cyclohexene oxide, propylene oxide, methyl glycidyl ether, ethyl glycidyl ether, phenyl glycidyl ether, allyl glycidyl ether, octylene oxide and dodecene oxide, and mixtures thereof.

An epoxy resin having a softening temperature above 80° C. may be used in combination with the above-described epoxy resin in such an amount that the present adhesive is not adversely affected. Examples of such epoxy resin include epoxy glycidyl ethers or polyglycidyl esters obtained by condensation of 1,2-dihydroxybenzene (or resorcinol), polyhydric phenols or polyhydric alcohols with epichlorohydrin; and solid epoxy resins, for instance, epoxy novolac resins (i.e., novolac type epoxy resins) obtained by condensation of novolac type phenolic resins (or halogenated novolac type phenolic resins) such as phenol novolac and cresol novolac with epichlorohydrin, polyolefins epoxidized by peroxidation process, epoxidized polybutadiene, naphthalene ring-containing epoxy resins, biphenyl type epoxy resins, phenol aralkyl type epoxy resins, biphenyl aralkyl type epoxy resins, and cyclopentadiene type epoxy resins.

The epoxy resin (B) is contained in the composition in an amount of from 5 to 60 wt %, preferably from 10 to 50 wt %, based on a total weight of the composition. If the content of the epoxy resin is below the aforesaid lower limit, adhesion strength of the cured adhesive may be smaller and the adhesive may not be thermocompression bonded well at a low temperature and a low pressure. If the content is above the aforesaid upper limit, a cured adhesive may have larger modulus of elasticity and larger humidity absorption, leading to lower reliability of a device.

The present composition can comprise a curing agent for epoxy resin in an amount not to adversely affect the composition. Any known curing agent may be used and examples thereof include The present composition can comprise a curing agent for epoxy resin in an amount not to adversely affect the invention. Any known curing agent for epoxy resins may be used, for examle, diethylenetriamine, triethylenetetramine, diethylaminopropylamine, N-aminoethylpiperazine, bis(4-amino-3-methylcyclohexyl)methane, meta-xylylenediamine, menthanediamine, and 3,9-bis(3-aminopropyl)-2,4,8,10-tetraoxaspiro(5,5)undecane; modified aliphatic polyamines such as epoxy resin-diethylenetriamine adduct, amine-ethylene oxide adduct, and cyanoethylated polyamine; phenolic resins having at least two phenolic hydroxyl groups per molecule, such as bisphenol A, trimethylol allyloxyphenol, phenol novolac resins having a low degree of polymerization, epoxidized or butylated phenolic resins, and phenolic resins available under the trade name of Super Beckacite 1001, ex Japan Reichhold Chemical Co., Ltd., Hitanol 4010, ex Hitachi Ltd., Scado form L. 9, ex Scado Zwoll, Netherlands, and Methylon 75108, ex General Electric Company; carbon resins available under the trade name of Beckamine P. 138, ex Japan Reichhold Chemical Co., Ltd., Melan, ex Hitachi Ltd., and U-Van 10R, ex Toyo Koatsu Kogyo Co., Ltd.; amino resins such as melamine resins and aniline resins; polysulfide resins having at least two mercapto groups per molecule, as represented by the formula: $HS(C_2H_4OCH_2OC_2H_4SS)_nC_2H_4OCH_2OC_2H_4SH$, wherein n is an integer of 1 to 10; and organic acids and acid anhydrides thereof such as phthalic anhydride, hexahydrophthalic anhydride, tetrahydrophthalic anhydride, pyromellitic anhydride, methylnadic acid, dodecylsuccinic anhydride, and chlorendic anhydride. Of the aforesaid curing agents, phenolic resins are desired because they imparts good molding property and humidity resistance to the present composition as well as they are non-toxic and relatively less costly. The curing agent described above may be used alone or as a mixture of two or more of them, depending on curing efficiency. An amount of the agent to be used is not limited to a particular range as far as desired properties are obtained.

The epoxy resin curing catalyst (C) used in the present invention is selected from imidazole compounds and dicyandiamide.

Examples of the imidazole compounds include imidazole derivatives such as 2-methylimidazole, 2-ethyl-4-methylimidazole, 1-cyanoethyl-2-methylimidazole, and 2-phenyl-4,5-dihydroxymethylimidazole.

The curing catalyst for epoxy resin in the present invention may be used alone or as a mixture of two or more of the above-described catalysts. An imidazole compound and dicyandiamide may be used in combination. The epoxy resin curing catalyst (C) is contained in the composition in an amount of from 0.001 to 20 wt %, preferably from 0.01 to 10 wt %, based on a total weight of the composition.

In the composition of the present invention, the silica particles (D) increase melt viscosity of the adhesive layer to suppress displacement of a chip in resin encapsulation process and reduce moisture absorption and linear expansion coefficient of the cured composition. The silica particles are spherical and have an average diameter of 0.1 µm to 10 µm, preferably 0.5 µm to 5 µm, and a greatest particle diameter of 20 µm or less. When the average diameter exceeds the aforesaid upper limit, a surface of the adhesive layer composed of the present composition may not be smooth. The silica particles are preferably surface treated with an organosilicone compound having an epoxy group.

Examples of the silica particles (D) include SE-2050, SC-2050, SC-205, SE-1050, SO-E1, SO-C1, SO-E2, SO-C2, SO-E3, SO-C3, SO-E5, SO-C5, all ex Admatechs Co., Ltd, and mixtures thereof.

The silica particles (D) are used in an amount of from 20 to 70 wt %, preferably from 30 to 65 wt % based on a total weight of the composition. An adhesive composition containing the particles more than the aforesaid upper limit may have larger moisture absorption and not be pressure bonded at a low temperature and a low pressure.

The present composition comprises (E) spherical fine particles of silicone rubber composite. The spherical fine particle of silicone rubber composite (E) comprises silicone rubber particle and fine bodies of polyorganosilsesquioxane resin polymerized on at least a part of the surface of the silicone rubber particle. The spherical fine particles of silicone rubber composite (E), together with the silica particles (D), attain larger minimum melt viscosity of the present adhesive and a cured product flexible enough to avoid cracking or exfoliation in a device package.

The silicone rubber particle has an average particle diameter of from 0.1 to 10 µm, preferably from 0.5 to 5 µm. If the diameter is larger than the aforesaid upper limit, a surface of the adhesive layer may not be flat. Preferably, maximum diameter is 20 µm or smaller, more preferably 10 µm or smaller. In the present invention, an average diameter is measured by laser diffraction and scattering method.

The spherical fine particles of silicone rubber composite (E) is contained in an amount of from 5 to 30 wt %, preferably from 10 to 20 wt %, based on a total weight of the composition. An adhesive composition containing the fine powder (E) in an amount outside the aforesaid range may be difficult to pressure bond at a low temperature and low pressure. Moreover, cured adhesive composition may have larger coefficient of linear expansion.

The spherical fine particles of silicone rubber composite (E) may be prepared by a known method described, for example, in Japanese Patent Application Laid-open No.7-196815. That is, adding alkaline substance or alkaline aqueous solution and organotrialkoxysilane to an aqueous dispersion of spherical silicone rubber fine powder having an average diameter of from 0.1 to 10 µm and, then, hydrolyzing and polymerizing the organotrialkoxysilane on the spherical silicone rubber surface followed by drying. An amount of the polyorganosilsesquioxane used is 1 to 500 parts by weight, preferably from 2 to 100 parts by weight, per 100 parts by weight of the silicone rubber fine powder. If the amount is below the aforesaid lower limit, silicone rubber composite fine powder may be difficult to disperse in the components (A) and (B), resulting in inhomogeneity in adhesive layer. If the amount is above the aforesaid upper limit, cured adhesive composition may have larger modulus of elasticity.

Examples of the spherical fine particles of silicone rubber composite (E) include KMP-600, KMP-605, and X-52-7030, all available from Shin-Etsu Chemical Co., Ltd. A mixture of these particles can be used.

In addition to the present composition, optional components may be added, for example, filler such as alumina, titanium oxide, carbon black, and electrically conductive particles, inorganic or organic pigments, colorants such as dies, wetting aids, antioxidants, and thermal stabilizers.

The present composition may be prepared by mixing in the usual manner the aforesaid polyimide resin (A), epoxy resin (B), epoxy resin curing catalyst (C), silica particles (D) and fine particles of silicone rubber composite (E), and optional components.

The present adhesive composition can be used to form an adhesive layer of an adhesive film and of a dicing and die bonding sheet. By dissolving an appropriate amount of the adhesive composition in an aprotic polar solvent such as toluene, cyclohexanone, and NMP, an adhesive agent is prepared. The adhesive agent is then applied to pads of a circuit board and dried, on which an object to be bonded is pressure bonded and then heated to cure the adhesive.

An adhesive film can be prepared by applying the adhesive agent on a substrate film and then drying to form the adhesive layer. The adhesive layer is bonded to a substrate such as a BT substrate and then the substrate film of the adhesive layer is peeled off from the adhesive layer. On the exposed adhesive layer, an object to be bonded is pressure bonded and then heated to cure the adhesive. As the substrate film, polyethylene, polypropylene, polyester, polyamide, polyimide, polyamideimide, polyetherimide, or polytetrafluoroethylene film, paper, and metal foils can be used. The substrate may be surface treated with a release agent.

The applied adhesive composition is preferably dried at a temperature of from room temperature to 200° C., particularly from 80 to 150° C. for 1 minute to 1 hour, particularly from 3 to 20 minutes. A thickness of the applied adhesive can be selected depending on an intended use of the adhesive, and preferably ranges from 10 to 100 µm, more preferably from 15 to 50 µm. The applied adhesive is cured after pressure bonded at a pressure of from 0.01 to 10 MPa, particularly from 0.1 to 2 MPa, at a temperature of from 100 to 200° C., preferably from 120 to 180° C. for 30 minutes to 5 hours, particularly from 1 to 2 hours.

Figure 1:
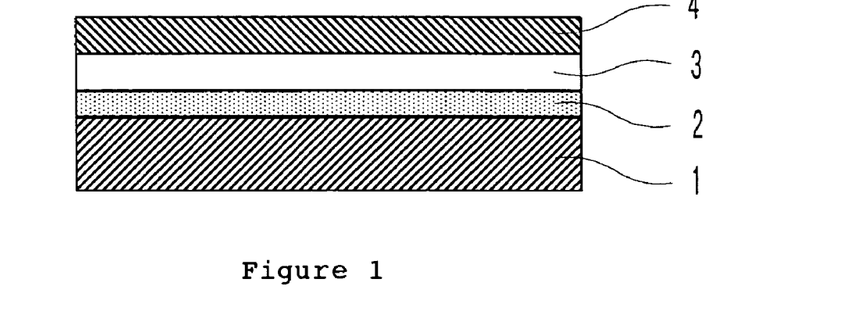
FIG. 1 is a cross-sectional view of the dicing and die bonding sheet of a first embodiment of the present invention.
Figure 2:
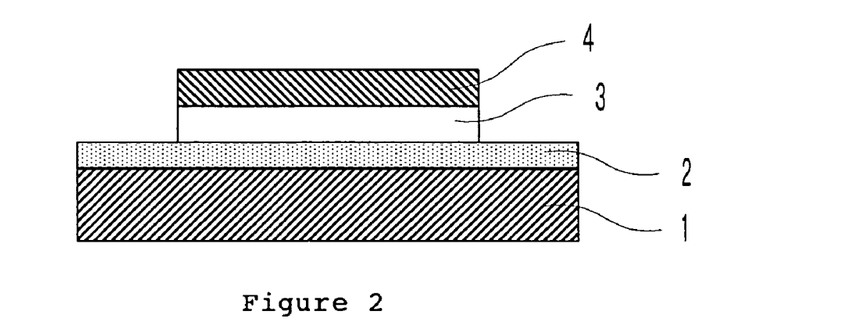
FIG. 2 is a cross-sectional view of the dicing and die bonding sheet of a second embodiment of the present invention.

The dicing and die bonding sheet comprises a substrate, a pressure sensitive adhesive layer provided on the substrate, and an adhesive layer made from the present composition provided on the pressure sensitive adhesive layer. FIG. 1 is a cross sectional view of an exemplary dicing and die bonding sheet consisting of the substrate 1 for the pressure sensitive adhesive layer 2, the pressure sensitive adhesive layer 2, the adhesive layer 3, and the substrate 4 for the adhesive layer 3. FIG. 2 is a cross sectional view of the exemplary dicing and die bonding sheet of FIG. 1, wherein the adhesive layer 3, and the substrate 4 for the adhesive layer 3 are cut out in the form according to a silicon wafer. In the present invention, a sheet includes tape.

For the substrate 1, the aforesaid materials for the substrate film for the adhesive layer can be used. That is, use may be made of films of polymers, for example, polyolefin such as polyethylene, polypropylene, polybutadiene, polubutene, polymethylpentene, polyvinylchloride and copolymer thereof; polyester such as polyethylene terephthalate, and polybutylene terephthalate; (meth)acrylic acid copolymer, vinyl acetate copolymer, polyether ketone, polyether ether ketone, polyether sulfone, polyamide, polyimide, polyether imide, polycarbonate, or polystyrene. These films may be surface treated with plasma or corona. Further, a laminated film of the aforesaid films may be used. Among these, polyethylene film and polypropylene film are preferred because the films are so expandable that diced chips can be separated from each other by expanding the film.

A thickness of the substrate film may be selected depending on film material and its expandability. Typically, the thickness ranges from 20 to 400 μm, preferably from 30 to 150 μm.

The pressure sensitive adhesive layer 2 is prepared from a pressure sensitive silicone adhesive composition which is not miscible with the adhesive layer. For example, use may be made of a commonly used heat-curable composition comprising a linear organopolysiloxane and a solid silicone resin. There are two types of heat-curable compositions, i.e., the one cured with an organic peroxide and the one cured with platinum metal catalyst. The latter one is preferred when a substrate of the pressure sensitive adhesive layer is a polyethylene or polypropylene film, because it can be cured at a lower temperature than the former one.

An example of the pressure sensitive silicone adhesive composition cured with an organic peroxide comprises (i) a linear orgnopolysiloxane, (ii) an organopolysiloxane copolymer resin composed of $R^{14}_3SiO_{1/2}$ units and $SiO_2$ units, wherein $R^{14}$ is a substituted or unsubstituted monovalent organic hydrocarbon group and molar ratio of $R^{14}_3SiO_{1/2}$ units to $SiO_2$ units ranges from 0.5 to 1.5, and (iii) a crosslinker such as benzoylperoxide, bis(4-methylbenzoylperoxide), and 2,5-dimethyl-2,5-bis(t-butylperoxy)hexane.

An example of the pressure sensitive adhesive silicone composition cured by addition reaction with an platinum metal compound catalyst comprises (i) a linear organopolysiloxane having vinyl groups, (ii) the aforesaid organopolysiloxane copolymer resin, (iii) a crosslinker such as an organohydrogenpolysiloxane having SiH bonds, and (iv) a platinum metal catalyst such as chloroplatinic acid, alcohol-modified chloroplatinic acid, and platinum complex with a vinylsiloxane.

An adhesion strength between a pressure sensitive adhesive layer prepared from the aforesaid silicone composition and the adhesive layer prepared from the present composition ranges from 0.05 to 1.0 N/25 mm, preferably from 0.1 to 0.7 N/25 mm. If the adhesion strength is smaller than the aforesaid lower limit, diced chip may fly off with the pressure sensitive adhesive layer attached at the back of the chip. If the adhesion strength is larger than the aforesaid upper limit, picking up of the diced chips from the pressure sensitive adhesive layer may be difficult. The adhesion strength can be adjusted within the aforesaid range by adjusting a degree of crosslinkage and a content of the silicone resin.

The present dicing and die bonding sheet can be prepared by applying the pressure sensitive adhesive silicone composition to the plastic film substrate 1 and then heat curing the composition to form pressure sensitive adhesive layer 2. The film obtained is hereinafter referred to a pressure sensitive adhesive film. The pressure sensitive adhesive layer 2 has a thickness of from 5 to 100 μm, preferably from 10 to 50 μm. The heat curing is typically performed at a temperature of from 60 to 120° C., though the temperature may be varied depending on heat resistance of the plastic substrate 1.

On the surface of the pressure sensitive adhesive layer 2, the surface of the adhesive film prepared as described above is pressure bonded to form the present dicing and die bonding sheet. The pressure bonding may be performed at a pressure of from 0.01 to 2 MPa, preferably from 0.1 to 1 MPa at room temperature.

Figure 3:
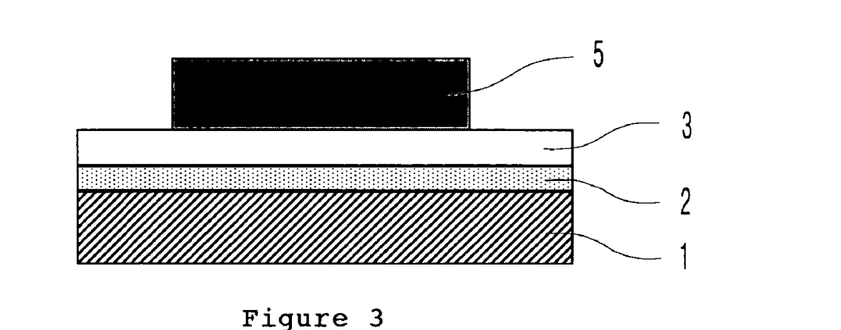
FIG. 3 is a cross-sectional view illustrating a silicon wafer bonded to the dicing and die bonding sheet of the first embodiment of the present invention.
Figure 4:
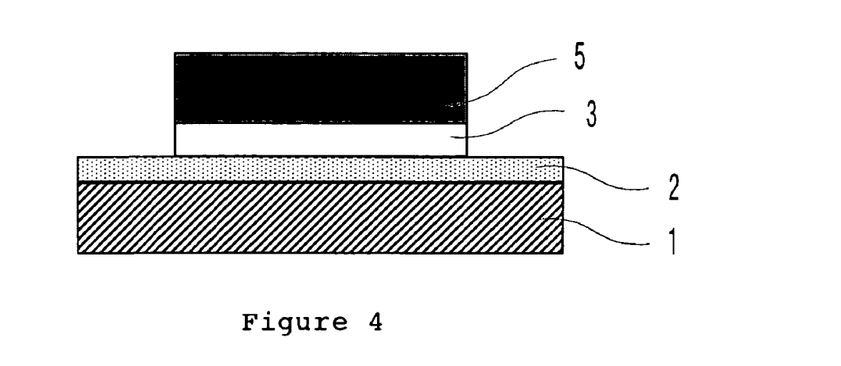
FIG. 4 is a cross-sectional view illustrating a silicon wafer secured to the dicing and die bonding sheet of the second embodiment of the present invention.

The present dicing and die bonding sheet is used as explained below with reference to FIGS. 1 to 4. In FIGS. 1 and 2, the substrate film 4 is peeled off and, to the exposed surface of the adhesive layer 3, a silicon wafer is thermocompression bonded. FIGS. 3 and 4 are cross sectional views in which silicone wafer 5 is bonded to the adhesive layer 3. Conditions of the thermocompression bonding can be selected depending on properties of adhesive layer. Typically, the thermocompression bonding is performed at a temperature of from 40 to 120° C. and at a pressure of 0.01 to 0.2 MPa. After dicing the wafer, diced chip is picked up with the diced adhesive layer bonded at the back of the chip from the pressure sensitive adhesive layer 2. The picked up chip is thermocompression bonded to a substrate such as a resinous circuit board or a lead flame via the diced adhesive layer which then is heat cured at a temperature of from 120 to 250° C. The heat curing of the adhesive layer may be carried out simultaneously with heat curing the encapsulating resin in an encapsulation process. In that case, the chip is thermocompression bonded at a temperature of from 40 to 200° C. and at a pressure of 0.01 to 0.2 MPa.

The present dicing and die-bonding sheet can be used not only for preparing semiconductor devices but also in various manufacturing processes which include bonding and dicing procedures.

EXAMPLES

The present invention will be elucidated with reference to the Examples and the Comparative Examples, but shall not be limited thereto.

Synthesis Example 1

Polyimidesilicone Resin Having a Phenolic Hydroxyl Group-1

In a 1 liter separable flask equipped with a reflux condenser, a stoppered 25 ml quantitative water receiver connected to the reflux condenser, a thermometer, and a stirrer, were added 32.2 parts by weight of 3,3',4,4'-benzophenone tetracarboxylic acid dianhydride and 150 parts by weight of 2-methylpyrolidone as a solvent, and stirred to disperse the acid anhydride. In the above dispersion, was added dropwise a dispersion of 51.28 party by weight of the dimethyldiaminopolysiloxane of the following formula, wherein j is an integer in such a range that the averaged "j" gives an amine equivalent of 641, hereinafter referred to as "diaminosiloxane-1", in 50 parts by weight of 2-methylpyrolidone, and then subjected to reaction at a room temperature for 1 hour under stirring to prepare an oligomer of amic acid, which is rich in acid anhydride. In the solution of the amic acid oligomer thus obtained, were added dropwise 29.68 parts by weight of aromatic diamine having phenolic a hydroxyl group, hereinafter referred to as "phenoldiamine-1", and 140 parts by weight of 2-methylpyrrolidone, stirred at a room temperature for 16 hours to prepare a polyamic acid solution. Then, 80 ml of toluene was added and the reaction system was heated and refluxed at 180° C. for 4 hours. It was confirmed that a prescribed amount of water was collected and no water was distilled off any more and then toluene was removed at 180° C. while removing the distillate collected in the water measuring receiver. After the completion of the reaction, the obtained reaction mixture was added dropwise into a large excess amount of methanol to precipitate the polymer. The resulting polymer was dried under reduced pressure to obtain the polyimidesilicone resin-1 having a phenolic hydroxyl group.

The IR absorption spectra of the resulting resin did not show absorption based on polyamic acid that indicates the presence of the unreacted functional group, but instead showed absorption at 1780 cm$^{-1}$ and 1720 cm$^{-1}$ based on imide groups and absorption around 3500 cm$^{-1}$ based on a phenolic hydroxyl group. The weight average molecular weight was 56,000, reduced to polystyrene, as determined by gel permeation chromatography (GPC) using tetrahydrofuran as a solvent.

Synthesis Example 2

Polyimidesilicone Resin Having a Phenolic Hydroxyl Group-2

The same procedures as those in Preparation Example 1 were repeated to obtain a polyimidesilicone resin-2, except that use was made of 31.0 parts by weight of bis(3,4-dicarboxyphenyl)ether acid dianhydride instead of 3,3',4,4'-benzophenone tetracarboxylic dianhydride; 64.1 parts by weight of diaminosiloxane-1; 12.9 parts by weight of the following aromatic diamine having phenolic hydroxyl groups, phenoldiamine-2, instead of phenoldiamine-1; and 325 parts by weight, in total, of 2-methylpyrrolidone. The molecular weight was 63,000.

Synthesis Example 3

Polyimidesilicone Resin-3

The same procedures as those in Preparation Example 1 were repeated to obtain a polyimidesilicone resin-3, except that use was made of 44.4 parts by weight of 6FDA(2,2-bis (3,4-dicarboxyphenyl)hexafluoropropane instead of 3,3',4,4'-benzophenone tetracarboxylic dianhydride; 56.98 parts by weight of a dimethyldiaminopolysiloxane with an amine equivalent of 407, which diaminosiloxane was different from diaminosiloxane-1 only in terms of amine equivalent, (hereinafter referred to as "diaminosiloxane-2"); 12.3 parts by weight of BAPP (2,2-bis[4-(4-aminophenoxy)phenyl]propane) instead of phenoldiamine-1; and 340 parts by weight, in total, of 2-methylpyrrolidone. The molecular weight was 72,000.

Synthesis Example 4

Polyimidesilicone Resin-4

The same procedures as those in Preparation Example 1 were repeated to obtain a polyimidesilicone resin-4, except that use was made of 44.4 parts by weight of 6FDA(2,2-bis (3,4-dicarboxyphenyl)hexafluoropropane instead of 3,3',4,4'-benzophenone tetracarboxylic dianhydride, 0.51 parts by weight of diaminosiloxane-2 instead of diaminosiloxane-1, 34.44 parts by weight of BAPP, (2,2-bis[4-(4-aminophenoxy) phenyl]propane instead of phenoldiamine-1, and 290 parts by weight, in total, of 2-methylpyrrolidone. The molecular weight was 74,000.

Preparation of Polyimide Resin Solution

Forty parts by weight of each polyimide resins 1-4, obtained in the Preparation Examples 1 to 4, were dissolved in 60 parts by weight of cyclohexanone to obtain polyimide solutions.

Preparation of Adhesive Compositions

Examples 1-6, Comparative Examples 1-2, and Reference Examples 1-2

With each polyimide solution, an epoxy resin, a catalyst, silica, and fine particles of a composite silicone rubber were mixed according to the formulations indicated in the following Table 1 in a mixer of rotation and revolution type manufactured by Thinky Corporation to prepare an adhesive composition.

Preparation of Adhesive Films I-X

Each adhesive composition was applied in such an amount to form 25 μm-thick layer or 50 μm-thick layer on 50-μm thick PET films coated with a fluorinated silicone release agent. The films were heat dried at 120° C. for 30 minutes to form adhesive films.

Preparation of Pressure sensitive silicone adhesive Agents I-IV

Preparation Example 1

A mixture of 33.33 parts by weight of a 60 wt % solution of methylpolysiloxane resin, composed of $(CH_3)_3SiO_{1/2}$ units and $SiO_2$ units in a molar ratio of 1.1:1, in toluene; 80 parts by weight of a raw rubber-like dimethylpolysiloxane, with a polymerization degree of 2,000, having vinyl groups at terminal and in side chains in a proportion of 0.002 mole per 100 g of the dimethylpolysiloxane; and 172 parts by weight of toluene were stirred until a homogeneous state is effected. To the mixture, were added 0.68 parts by weight of an organopolysiloxane compound having hydrogen atoms bonded to silicon atoms, as represented by the following structure and 0.24 parts by weight of 3-methyl-1-butyn-3-ol as a reaction retarder. Then to this mixture, a solution of chloroplatinic acid modified with 2-ethylhexanol was added in an amount of 40 ppm as platinum to prepare a pressure sensitive silicone adhesive composition-I.

Preparation Example 2

According to Preparation Example 1, a pressure sensitive silicone adhesive composition-II was prepared from 50 parts by weight of a 60 wt % solution of methylpolysiloxane resin, composed of $(CH_3)_3SiO_{1/2}$ units and $SiO_2$ units in a molar ratio of 1.1:1 in toluene; 70 parts by weight of a raw rubber-like dimethylpolysiloxane, with a polymerization degree of 2,000, having vinyl groups at terminal and in side chains in a proportion of 0.002 mole per 100 g of the dimethylpolysiloxane; 165.7 parts by weight of toluene; 0.64 parts by weight of an organopolysiloxane compound having hydrogen atoms bonded to silicon atoms, as represented by the above structure; 0.24 parts by weight of 3-methyl-1-butyn-3-ol as a reaction retarder; and a solution of chloroplatinic acid modified with 2-ethyhexanol in an amount of 40 ppm as platinum.

Preparation Example 3

According to Preparation Example 1, a pressure sensitive silicone adhesive composition-III was prepared from 16.66 parts by weight of a 60 wt % solution of methylpolysiloxane resin, composed of $(CH_3)_3SiO_{1/2}$ unit and $SiO_2$ unit in a molar ratio of 1.1:1 in toluene; 90 parts by weight of a raw rubber-like dimethylpolysiloxane, with a polymerization degree of 2,000, having vinyl groups at terminal and in side chains in a proportion of 0.002 mole per 100 g of the dimethylpolysiloxane; 180 parts by weight of toluene; 0.77 parts by weight of an organopolysiloxane compound having hydrogen atoms bonded to silicon atoms, as represented by the above structure; 0.24 parts by weight of 3-methyl-1-butyn-3-ol as a reaction retarder; and a solution of chloroplatinic acid modified with 2-ethyhexanol in an amount of 40 ppm as platinum.

Preparation Example 4

According to Preparation Example 1, a pressure sensitive silicone adhesive composition-IV was prepared from 83.33 parts by weight of a 60 wt % solution of methylpolysiloxane resin, composed of $(CH_3)_3SiO_{1/2}$ unit and $SiO_2$ unit in a molar ratio of 1.1:1 in toluene; 50 parts by weight of a raw rubber-like dimethylpolysiloxane, with a polymerization degree of 2,000, having vinyl groups at terminal and in side chains in a proportion of 0.002 mole per 100 g of the dimethylpolysiloxane; 152.4 parts by weight of toluene; 0.46 parts by weight of an organopolysiloxane compound having hydrogen atoms bonded to silicon atoms, as represented by the above structure; 0.24 parts by weight of 3-methyl-1-butyn-3-ol as a reaction retarder; and a solution of chloroplatinic acid modified with 2-ethyhexanol in an amount of 40 ppm as platinum.

Preparation of Pressure Sensitive Adhesive Film

Pressure sensitive silicone adhesive films I-IV were prepared by applying pressure sensitive silicone adhesive compositions I-IV described above on un-stretched polyethylene (LDP) film with a thickness of 100 µm and drying them at a temperature of 100° C. for 10 minutes to form pressure sensitive silicone adhesive layers having a thickness of 15 µm.

Preparation of Dicing and Die Bonding Sheets

Examples 7-13, Comparative Examples 3-4, and Reference Examples 3-6

The pressure sensitive adhesive film thus obtained was pressure bonded with its pressure sensitive adhesive layer side facing to the surface of the adhesive layer of the adhesive film at 2 kg of load, using a roll having a width of 300 mm, according to combinations indicated in Table 2 to form dicing and die bonding sheets I-XIII.

Minimum melt viscosity was determined on each uncured adhesive film. Dispersibility of silicone rubber particle, glass transition temperature, linear expansion coefficient, Young's modulus, and moisture absorption were determined on each cured adhesive. Adhesion strength, adhesion strength after moisturizing and heating, pressure sensitive adhesive strength, thermocompression bonding properties, pick up performance of chips in dicing process, occurrence of void and displacement of chip after resin encapsulation, and reliability of package were determined on each dicing and die bonding sheet. Each measuring method is described below. These results are shown in Tables 1 and 2.

Dispersibility of Silicone Rubber Particle

Each adhesive film of a film thickness of 25 µm was cured and its surface of the adhesive layer was observed for presence of any concavity and convexity due to poor dispersibility of silicone powder. Films without concavity and convexity were rated as A and films with concavity and convexity were rated as B.

Glass Transition Temperature, Linear Expansion Coefficient

Each adhesive film obtained was heat treated at a temperature of 175° C. for 2 hours for drying and curing. A piece of film of 20 mm×5 mm×50 µm was cut out to determine glass transition temperature and linear expansion coefficient with a thermomechanical analyser, TMA-2000, ex ULVAC Inc., in a tension mode under the following conditions: chuck distance: 15 mm; temperature: 25-300° C.; temperature rise rate: 5° C./minute; and measuring load: 3 g.

Young's Modulus

Each adhesive film obtained as described above was heated at a temperature of 175° C. for 2 hours for curing. A piece of film of 40 mm×10 mm×50 µm was cut out to determine Young's modulus using a dynamic viscoelastometry instrument. Determination was made in a tension mode under the following conditions: chuck distance: 10 mm; temperature: 25° C.; and frequencies: 1 Hz.

Moisture Absorption

Each adhesive film obtained as described above was heated at a temperature of 175° C. for 2 hours for curing. A piece of film of 150 mm×150 mm×50 μm was cut out and maintained under the condition of 85° C./85% RH for 168 hours. The moisture absorption was determined from changes in weight.

Minimum Melt Viscosity

Twenty sheets of 50 μm thick adhesive layer in uncured state were stacked at 80° C. to prepare a sample specimen having a thickness of about 1 mm. Using this specimen, melt viscosity of the adhesive compositions in the form of film was determined with parallel plate viscoelasticity measuring instrument, MR-300, ex Rheology Co., Ltd.

Adhesion Strength

Each dicing and die bonding tape was thermocompression bonded to a silicon wafer having a diameter of 6 inch and a thickness of 450 μm and the wafer was diced into chips of 2 mm×2 mm. The silicon chips with the adhesive layer attached on their back side were picked up and thermocompression bonded at 150° C. and at 0.1 MPa for 2 seconds to a 10 mm×10 mm BT substrate and a silicon substrate, respectively, each substrate having a cured photoresist, AUS 303, ex Unitechno Inc., layer on its surface.

The obtained test samples were heated at 175° C. for 2 hours for curing to prepare test specimens for adhesive property test. Shear adhesive strength was determined at a temperature of 240° C. with a bond tester, 4000 PXY, ex Dage Arctek Co., Ltd.

Adhesion Strength After Moisturizing and Heating

The test specimens for adhesive property test prepared as described above were maintained under the condition of 85° C./60% RH for 168 hours, and then passed through a reflow furnace at 260° C. for three times. Then shear adhesive strength was determined at 240° C. according to the aforesaid method.

Determination of Pressure Sensitive Adhesive Strength

Each dicing and die bonding sheet obtained as described above was cut out into a tape having a width of 25 mm. The substrate film on the adhesive layer side was peeled off and the exposed adhesive layer surface was thermocompression bonded at 80° C. and 0.01 MPa to a plate of glass having a thickness of 2.0 mm and a width of 50 mm for 10 seconds. This test sample was left under constant temperature of 25±2° C. and constant humidity of 50±5% RH for 24 hours. Then, one end of the pressure sensitive adhesive film was peeled off from the adhesive layer and 180-degree peel force was measured at a pulling rate of 300 mm/minute.

Dicing and Chip Pick up Test

The substrate film on the adhesive layer side of each dicing and die bonding sheet obtained as described above was peeled off and the exposed adhesive layer was thermocompression bonded to a wafer having a diameter of 8 inch and a thickness of 150 μm on, using a film mounter, FM-114, ex Technovision Inc., at 80° C. at a rolling pressure of 2 kg. The wafer was diced into chips of 10 mm X 10 mm and the chips were picked up with a die bonder instrument, BESTEM-D02-TypeC, ex NEC Machinery Corporation. Each dicing and die boding tape was rated as "A" when no chip was flown off or scattered in the dicing process, otherwise as "B"; and was rated as "A" when chips were picked up without problems, otherwise as "B", as shown in Table 2.

Thermocompression Bonding Property

The dicing and die bonding tape obtained as described above was cut into a strip of a width of 25 mm and a length of 200 mm. The substrate film on the adhesive layer side of the strip was peeled off and the exposed adhesive layer was thermocompression bonded to a mirror finished surface of a wafer at a temperature of from 50 to 80° C. Then the pressure sensitive adhesive layer was peeled off to examine occurrence of exfoliation of the adhesive layer from the wafer surface. When the adhesive layer was peeled off together with the pressure sensitive adhesive layer, it was meant that thermocompression bonding property to the wafer was no good, and such a tape was rated as "B" in Table 2. When the pressure sensitive adhesive layer was peeled off from the interface with the adhesive layer, it was meant that chips can be picked up with the adhesive layer adhered thereon and, therefore, can be suitably used as a dicing and die bonding tape. Such a tape was rated as "A" in Table 2.

Occurrence of Void and Shifting of Chip

Each dicing and die bonding sheet was thermocompression bonded to an 8-inch Φ wafer having a thickness of 150 μm and then the wafer was diced into 8 mm×8 mm in a manner as described. Onto a 250 μm thick resin substrate (BT substrate having a cured photoresist, AUS 303, layer on a surface), the silicon chips were thermocompression bonded in a map-like pattern, at 0.1 M Pa, 150° C., for 1 second, then encapsulated with a moulding compound, KMC2500VA-T1, ex Shin-Etsu Chemical Co., Ltd. at a temperature of 175° C. with a molding pressure of 6.9 M Pa for 90 seconds, and heat cured at a temperature of 175° C. for 4 hours. The encapsulated chips were observed with an ultrasonic image observation instrument to examine occurrence of void and shifting of a chip. The results are shown in Table 2, where "A" means that shifting of chip or occurrence of void was not observed and "B" means that shifting or void was observed.

Reliability of Package

Twenty packages in total, obtained by splitting off encapsulated chips, were kept under the conditions of 30° C./60% RH for 192 hours, and then passed through a reflow furnace at 260° C. for three times. The packages were observed for void and exfoliation with an ultrasonic image determining instrument. The results are shown in Table 2, where "A" means exfoliation was not observed and "B" means that exfoliation was observed.

TABLE 1

|  | Example | | | | | | Com. Ex.* | | Ref Ex.** | |
| --- | --- | --- | --- | --- | --- | --- | --- | --- | --- | --- |
|  | 1 | 2 | 3 | 4 | 5 | 6 | 1 | 2 | 1 | 2 |
| Adhesive composition | I | II | III | IV | V | VI | X | VIII | VII | IX |
| (A) Polyimidesilicone resin | | | | | | | | | | |
| 1 | 20 | 17.5 | 15 | | 20 | | 50 | 25 | 20 | 20 |
| 2 | | | | 30 | | | | | | |
| 3 | | | | | | 28 | | | | |
| 4 | | | | | 10 | | | | | |
| (B) Epoxy resin | | | | | | | | | | |
| B1 | 19 | 16.63 | 19 | | 19 | | 47.5 | 23.75 | | 19 |
| B2 | | | | | | 11.4 | | | | |
| B3 | | | | 19 | | | | | | |
| Epicoat 1003 | | | | | | | | | 19 | |
| (C) Catalyst | | | | | | | | | | |
| Dicyanamide | 1 | 0.87 | 1 | | 1 | 0.6 | 2.5 | 1.25 | 1 | 1 |
| Imidazole | | | | 1 | | | | | | |
| (D) Spherical silica | | | | | | | | | | |
| D1 | 50 | 45 | 60 | | 40 | 50 | | 50 | 50 | 50 |
| D2 | | | | 35 | | | | | | |
| (E) Silicone rubber particle | | | | | | | | | | |
| E1 | 10 | 20 | 5 | 15 | 10 | | | | 10 | |
| E2 | | | | | | 10 | | | | |
| KMP597 | | | | | | | | | | 10 |
| Minimum melt viscosity of adhesive composition (Pa·s) | 2660 | 5580 | 6430 | 1320 | 2130 | 3840 | 160 | 610 | 3040 | — |
| Properties of adhesive film | | | | | | | | | | |
| Dispersibility of silicone rubber powder | A | A | A | A | A | A | — | A | A | B |
| Young's modulus (MPa) | 3160 | 2680 | 3940 | 2050 | 3540 | 2430 | 1650 | 4550 | 3020 | — |
| Tg (°C.) | 115 | 120 | 118 | 125 | 147 | 135 | 115 | 110 | 113 | — |
| Linear expansion coefficient α 1(ppm) | 55 | 72 | 48 | 85 | 68 | 77 | 117 | 78 | 53 | — |
| Linear expansion coefficient α 2(ppm) | 145 | 155 | 138 | 167 | 152 | 158 | 202 | 170 | 141 | — |
| Moisture absorption (%) | 0.3 | 0.3 | 0.2 | 0.3 | 0.3 | 0.2 | 0.8 | 0.3 | 0.3 | — |

*Comparative Example
**Reference Example

TABLE 2

|  | Example | | | | | | | Com Ex.* | | Ref. Ex.** | | | |
| --- | --- | --- | --- | --- | --- | --- | --- | --- | --- | --- | --- | --- | --- |
|  | 7 | 8 | 9 | 10 | 11 | 12 | 13 | 3 | 4 | 3 | 4 | 5 | 6 |
| Adhesive film | I | II | III | IV | V | VI | I | X | VIII | VII | IX | I | I |
| Pressure sensitive adhesive film | I | I | I | I | I | I | II | I | I | I | I | III | IV |
| Properties of dicing and die bonding film | | | | | | | | | | | | | |
| Pressure sensitive adhesive strength (N/25 mm) | 0.18 | 0.19 | 0.18 | 0.24 | 0.19 | 0.23 | 0.74 | 0.2 | 0.17 | 0.16 | — | 0.03 | 1.5 |
| Flying off of chip in dicing process | A | A | A | A | A | A | A | A | A | A | — | B | A |
| Chip pick up | A | A | A | A | A | A | A | A | A | A | — | — | B |
| Thermocompression bonding property | A | A | A | A | A | A | A | A | A | B | — | A | A |
| Adhesion strength (MPa) Silicon substrate Initial | 11 | 10 | 11 | 10 | 12 | 8.7 | 11 | 4.3 | 12 | — | — | 11 | 11 |
| After moisturizing | 9.5 | 9.1 | 9.7 | 8.9 | 8.5 | 7.5 | 9.5 | 3.1 | 9.1 | — | — | 9.5 | 9.5 |
| Adhesion strength (MPa) BT substrate Initial | 9.7 | 8.6 | 9.8 | 9.2 | 10 | 7.9 | 9.7 | 3.1 | 9.8 | — | — | 9.7 | 9.7 |
| After moisturizing | 8.5 | 7.9 | 9.0 | 8.2 | 8.2 | 7.0 | 8.5 | 0.85 | 8.9 | — | — | 8.5 | 8.5 |
| Displacement of chip | A | A | A | A | A | A | A | B | B | — | — | — | — |
| Occurrence of void after MC moulding | A | A | A | A | A | A | A | B | — | — | — | — | — |
| Exfoliation of package after reliability test | A | A | A | A | A | A | A | B | — | — | — | — | — |

*Comparative Example
**Reference Example

In Table 1, amounts of components are given in solid content. The resins used are as follows:

Resins and other materials used in the Examples

B1:RE-310S: liquid epoxy resin, ex Nippon Kayaku.
B2:RE-600N: epoxy resin (liquefying temperature: 60° C.), ex Nippon Kayaku.
B3:EOCN-102S:epoxy resin (softening temperature: 55-57° C.), ex Nippon Kayaku.
Dicyandiamide: ex Japan Epoxy Co., Ltd.
2PHZ: 2-phenyl-4,5-dihydroxymethylimidazole, ex Shikoku Chemicals Corporation.
D1:SE-2050:spherical silica, ex Admatechs Co., Ltd. (average particle size: 0.5 μm).

D2:SE-1050:spherical silica, ex Admatechs Co., Ltd. (average particle size: 0.1 μm).

E1:X-52-7030: Silicone rubber composite powder (average particle size: 0.7 μm), ex Shin-Etsu Chemical Co., Ltd.

E2:KMP-600: Silicone rubber composite powder (average particle size: 5 μm), ex Shin-Etsu Chemical Co., Ltd.

Resins Used in the Reference Examples

Epicoat M 1003: epoxy resin (softening temperature: 89° C.) ex Japan Epoxy Resin Co.

KMP-597:Silicone rubber particle (average particle size: 5 μm), ex Shin-Etsu Chemical Co., Ltd.

The composition of Comparative Example 1 did not comprise fine particles to show a low minimum melt viscosity. The sheet of Comparative Example 3 comprising the adhesive layer prepared from the composition caused displacement of chips, as seen in Table 1.

The composition of Comparative Example 2 comprised spherical silica and has a higher melt viscosity than that of Comparative Example 1. However, the die bonding sheet of Comparative Example 4 exhibited displacement of chip and had a higher Young's modulus.

The composition of Reference Example 1 comprises an epoxy resin with a high softening temperature. The sheet prepared from the composition could not be thermocompression bonded as seen in Reference Example 3 and, therefore, could not be evaluated for adhesive property and so on.

The composition of Reference Example 2 comprises fine particles of silicone rubber which does not have fine bodies of polyorganosilsesquioxane resin on the surface. The powders were bad in dispersibility in resin system and, therefore, could not be used for an adhesive sheet.

References 5 and 6 comprised a layer composed of the adhesive of the present invention. However, the adhesive strength to the pressure sensitive layer was out of the scope of the present invention and caused chip to fly off or had problems in picking up chips.

Contrary to these, the die bonding sheet comprising the adhesive of the Examples and a layer thereof were good in all of the properties.

INDUSTRIAL APPLICABILITY

The adhesive composition of the present invention provides a cured adhesive layer having low elasticity, low linear expansion, and low moisture absorption. The composition is suitable for bonding various electronic parts. The adhesive sheet for dicing and die bonding of the present invention allows easy pick up of wafer chips. By thermocompression bonding the picked up chips to a substrate and heat curing the adhesive, the chips are securely bonded to a substrate.

The invention claimed is:

1. A dicing and die bonding sheet comprising
a substrate,
a pressure sensitive silicone adhesive layer provided on the substrate, and
an adhesive layer provided on the pressure sensitive silicone adhesive layer, said latter adhesive layer being prepared from an adhesive composition comprising: 5 to 60 wt % of (A) a polyimidesilicone resin; 5 to 60 wt % of (B) an epoxy resin having a softening point of 80° C. or lower; 0.001 to 20 wt % of (C) dicyandiamide; 20 to 70 wt % of (D) spherical silica having an average diameter of 0.1 to 10 μm; and 5 to 30 wt % of (E) spherical fine particles of silicone rubber composite, wherein said wt % is based on a total weight of the adhesive composition,
wherein a 180-degree peel force measured by peeling off the pressure sensitive adhesive layer from the adhesive layer provided on the pressure sensitive silicone adhesive layer ranges from 0.05 to 1.0 N/25 mm.

2. The dicing and die bonding sheet according to claim 1, wherein the pressure sensitive silicone adhesive layer is composed of a silicone composition which has been cured by an addition reaction with a platinum catalyst.

3. The dicing and die bonding sheet according to claim 1, wherein, in said adhesive composition, the spherical fine particles of silicone rubber composite (E) are composed of spherical fine particles of silicone rubber having an average particle diameter of from 0.1 to 10 μm and fine bodies of polyorganosilsesquioxane resin on a surface thereof.

4. The dicing and die bonding sheet according to claim 1, wherein said adhesive composition has a minimum melt viscosity of 1000 Pa·s or larger, measured with a parallel plate rheometer.

5. The dicing and die bonding sheet according to claim 1, wherein, in said adhesive composition, the polylinidesilicone resin (A) has a phenolic hydroxyl group.

6. The dicing and die bonding sheet according to claim 1, wherein, in said adhesive composition, the polyimidesilicone resin (A) comprises a polyimide resin prepared by reacting a tetracarboxylic acid dianhydride with a diamine compound represented by the following formula (1)

(I)

wherein $R^3$ is a divalent organic group having 3 to 9 carbon atoms, $R^4$ may be same with or different from each other and is a substituted or unsubstituted monovalent hydrocarbon group having 1 to 8 carbon atoms, and m is an integer of from 1 to 200.

* * * * *